United States Patent
Wang et al.

(10) Patent No.: US 11,424,635 B2
(45) Date of Patent: Aug. 23, 2022

(54) BATTERY STATE ESTIMATION USING INJECTED CURRENT OSCILLATION

(71) Applicant: GM GLOBAL TECHNOLOGY OPERATIONS LLC, Detroit, MI (US)

(72) Inventors: Meixian Wang, Troy, MI (US); Yue-Yun Wang, Troy, MI (US); Houchun Xia, Troy, MI (US); Justin Bunnell, Northville, MI (US); Charles W. Wampler, Birmingham, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 326 days.

(21) Appl. No.: 16/859,322

(22) Filed: Apr. 27, 2020

(65) Prior Publication Data
US 2021/0336462 A1 Oct. 28, 2021

(51) Int. Cl.
| | | |
|---|---|---|
| *H02J 7/00* | (2006.01) | |
| *G01R 31/389* | (2019.01) | |
| *B60L 15/20* | (2006.01) | |
| *G01R 31/396* | (2019.01) | |
| *B60L 58/12* | (2019.01) | |
| *B60L 53/62* | (2019.01) | |
| *G01R 31/3842* | (2019.01) | |

(52) U.S. Cl.
CPC ............ *H02J 7/0048* (2020.01); *B60L 15/20* (2013.01); *B60L 53/62* (2019.02); *B60L 58/12* (2019.02); *G01R 31/389* (2019.01); *G01R 31/3842* (2019.01); *G01R 31/396* (2019.01); *H02J 7/0068* (2013.01)

(58) Field of Classification Search
CPC .... H02J 7/0048; H02J 7/0068; H02J 2310/48; H02J 7/005; B60L 15/20; B60L 53/62; B60L 58/12; G01R 31/3842; G01R 31/389; G01R 31/396; G01R 31/386; G01R 31/367; G01R 31/382; H01M 2010/4278; H01M 2220/20; H01M 10/425; H01M 10/48; Y02T 10/70; Y02T 10/7072; Y02T 10/72; Y02T 90/12
USPC ........................................................ 320/132
See application file for complete search history.

(56) References Cited

U.S. PATENT DOCUMENTS 10,821,843 B2 * 11/2020 Slepchenkov ........ H02J 7/0048
2020/0081070 A1 * 3/2020 Chemali .............. G01R 31/392

* cited by examiner

*Primary Examiner* — Paul Dinh
(74) *Attorney, Agent, or Firm* — Quinn IP Law (57) ABSTRACT

A method for estimating a state of a battery pack using a controller having battery state estimator (BSE) logic includes receiving or delivering a constant baseline current via the battery pack. Current oscillations having time-variant frequency content are selectively injected into the baseline current via the controller in response to a predetermined condition. The baseline current and the current oscillations combine to form a final current. The method includes estimating a battery parameter via the BSE logic concurrently with the current oscillations to generate an estimated battery parameter, and estimating the present state of the battery pack via the controller using the estimated battery parameter. An electrical system includes a rotary electric machine that is electrically connected to and driven by the battery pack, and a controller configured to execute the method.

20 Claims, 6 Drawing Sheets

BATTERY STATE ESTIMATION USING INJECTED CURRENT OSCILLATION

INTRODUCTION

The present disclosure relates to the real-time estimation of modeled battery parameters and battery states of a multi-cell battery pack. Accurate estimation allows an associated controller to effectively and efficiently control a myriad of different power usage and utilization decisions during battery charging, steady-state, and discharging operating modes. The present disclosure thus lends itself to the real-time control of electrified powertrains, powerplants, robots, mobile platforms, and other types of electrical systems in which improved battery parameter and state estimation accuracy is desirable.

Ongoing measurements of the various responses to a given input are not always possible or practicable in a deterministic system, which in turn often necessitates the use of system models and response estimation based on such models. In a typical high-energy battery pack, for instance, such as a lithium-ion traction battery pack of an electric or hybrid electric motor vehicle, voltage and temperature are periodically measured and estimated as responses to electrical current. Different voltage states may be modeled, including equilibrium potential, hysteresis effects-based voltage responses, voltage drops due to ohmic resistance, voltage drops due to battery pack dynamics, e.g., double-layer and/or diffusion voltage, etc. Each of the exemplary voltage responses may be described in a model using an algebraic or differential function, or by using a convolution integral. The above-noted voltage responses in particular influence key battery state estimates such as state of charge (SOC) and state of power (SOP)/power capability. As a result, equivalent circuit models are typically used in conjunction with adaptive battery state estimation (BSE) logic in order to estimate voltage responses and other battery parameters.

As will be appreciated by those of ordinary skill in the art, a battery cell resting under open-circuit conditions, given sufficient time, will eventually settle at an equilibrium voltage referred to in the art as the cell's open-circuit voltage (OCV). Ideally, the OCV of a given battery cell is unique for each SOC independently of whether the battery cell was charging or discharging immediately prior to switching to an open-circuit condition, and independently of the magnitude of the battery current. While OCV is accurately ascertained in a battery pack in an off state for an extended duration, a key challenge presents itself when attempting to perform battery state estimations of a battery pack that is actively charging or discharging, particularly in dynamically changing operating environments.

In lithium-ion batteries in particular, a non-linear relationship exists between OCV and SOC. In hybrid electric and battery electric vehicles, for instance, BSE logic in the form of a programmed algorithm may reference an available OCV curve to help estimate SOC in real-time. Alternatively, SOC may be tracked over time from an initial SOC value using a procedure referred to in the art as Coulomb counting. Other BSE logic variations seek to balance voltage-based estimates with available Coulomb counting-based estimates in order to produce a composite estimate.

SUMMARY

A method and an associated system are disclosed herein that are intended to improve upon available battery parameter and state estimation accuracy in an electrical system having a multi-cell battery pack. As part of the disclosed solution, a controller is programmed to execute instructions embodying the present method, with the controller doing so using battery state estimation (BSE) logic and current control logic as described herein. The controller uses an application-specific equivalent circuit model to accurately estimate and regress one or more relevant battery parameters. Representative non-limiting regressed battery parameters within the scope of the present disclosure include open-circuit voltage (OCV), ohmic resistance (R-ohmic), and impedance of the battery pack, with SOC and SOP being representative battery states that may be estimated from such battery parameters using the disclosed approach.

As understood in the art, certain battery parameters enjoy greater predictive value than other battery parameters during higher-frequency current inputs, particularly when estimating SOC and SOP/power capability of a battery pack. As a result, it is desirable to optimize estimation accuracy for such battery parameters. Ohmic resistance is one such parameter. Ohmic resistance, which is generally defined as the apparent internal resistance of a battery pack and the resistance of the various electrical conductors used in the battery pack's construction. Ohmic resistance tends to manifest as an instantaneous cell voltage response to changes in battery current, is particularly significant to SOP/power capability estimations.

It is recognized herein as a basis for the present solution that battery state estimators configured to regress battery parameters, which may include Extended Kalman Filters, Sigma-Point Kalman Filters, recursive least-squares regression techniques, and the like, may experience insufficient levels of input signal variation/excitation under certain operating conditions. Insufficient excitation in turn may lead to inaccurate estimation results. Noise present in a signal measurement environment, such as measured electrical current, voltage, and temperature, may result in a low signal-to-noise ratio. When insufficient frequency content is present in the input signals being furnished to the resident BSE logic, the predicted battery parameters may tend to drift, with the battery parameters possibly rising or falling in a monotonic manner as a result. The present solution is therefore intended to address this problem by selectively modifying a constant baseline current of the battery pack, i.e., a charging or discharging current, by purposefully injecting time-variant frequency content in the form of current oscillations into the baseline current.

In a particular embodiment, a method is provided for estimating a state of a battery pack via a controller having BSE logic configured to regress a set of battery parameters. The method includes receiving or outputting a constant baseline current via the battery pack. The method also includes selectively requesting the injection/addition of time-variant frequency content in the form of current oscillations to the constant baseline current, with such a request occurring via the controller. This action is accomplished in response to a predetermined condition that is itself indicative of the above-noted insufficiency of frequency content. The constant baseline current and the current oscillations combine to form a final current.

The method in this particular embodiment includes estimating a battery parameter of the battery pack via the BSE logic to thereby provide an estimated battery parameter, and thereafter estimating the present state of the battery pack as an estimated battery state using the estimated battery parameter.

The BSE logic may include an extended Kalman filter or other Kalman filter formulation.

Selectively requesting the injection of the current oscillations into the constant baseline current may include requesting a constant charging current, via the controller, from an offboard charging station as the constant baseline current, and wherein controlling powerflow to or from the battery pack includes charging the battery pack using the final current. Alternatively, selectively requesting the injection of the current oscillations into the constant baseline current includes selectively controlling an ON/OFF state of an electrical load connected to the battery pack while receiving or delivering a constant baseline current to thereby create the current oscillations. Controlling the powerflow to or from the battery pack in this instance may include discharging the battery pack to the electrical load.

As another alternative, selectively requesting the injection of the current oscillations into the constant baseline current may include selectively requesting, from an offboard charging station, a series of constant charging currents each having a different frequency content to thereby create the current oscillations, and wherein controlling the powerflow to or from the battery pack using the estimated battery state includes charging the battery pack using the final current, or communicating a charging request from the controller to an offboard smart charger. Such a smart charger may be configured to detect a requirement of the battery pack for the final current, and that is configured to transmit the final current to the battery pack as a charging current.

The battery parameter may include an ohmic resistance, an impedance, and/or an open-circuit voltage of the battery pack in various embodiments.

In an exemplary embodiment, the frequency of the current oscillations may be less than about 1 Hz, and the constant baseline current may have a frequency of less than about 0.01 Hz. The current oscillations may include a pseudo-random binary signal having a time-variant frequency, or pulse width modulation or pulse density modulation signal having a time-variant frequency, or a sequence of chirp signals.

In a possible embodiment, the predetermined condition may include a threshold covariance or an estimated error value from the BSE logic, or a duration over which the constant baseline current remains constant prior to injection of the current oscillations.

An electrical system is also disclosed herein that, according to an exemplary embodiment, includes a rotary electric machine that is electrically connected to and driven by the battery pack, and a controller configured to estimate a present state of a battery pack using the BSE logic noted above. In an exemplary embodiment, the controller is configured to determine, via the BSE logic, a frequency content of a constant baseline current delivered to or from the battery pack, wherein the constant baseline current has a frequency of less than about 0.01 Hz. The controller is also configured to selectively request an injection of current oscillations into the constant baseline current in response to a predetermined condition, with the constant baseline current and the current oscillations combining to form a final current. In a non-limiting embodiment, the current oscillations have a frequency in a range of between about 0.1 Hz and 1 Hz, e.g., within ±5% or ±10% of the stated values or an otherwise reasonable tolerance thereof, and to estimate a battery parameter of the battery pack via the BSE logic concurrently with the current oscillations to thereby generate an estimated battery parameter. The estimated battery parameter in this embodiment is an ohmic resistance, an impedance, and/or an open-circuit voltage of the battery pack.

The controller is further configured to estimate the present state of the battery pack using the estimated battery parameter as an estimated battery state, and to thereafter control, using the estimated battery state, a powerflow from or to the electric machine respectively to or from the battery pack. One or more road wheels may be connected to the rotary electric machine.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the appended claims.

The present disclosure is susceptible to modifications and alternative forms, with representative embodiments shown by way of example in the drawings and described in detail below. Inventive aspects of this disclosure are not limited to the particular forms disclosed. Rather, the present disclosure is intended to cover modifications, equivalents, combinations, and alternatives falling within the scope of the disclosure as defined by the appended claims.

DETAILED DESCRIPTION

Figure 1:
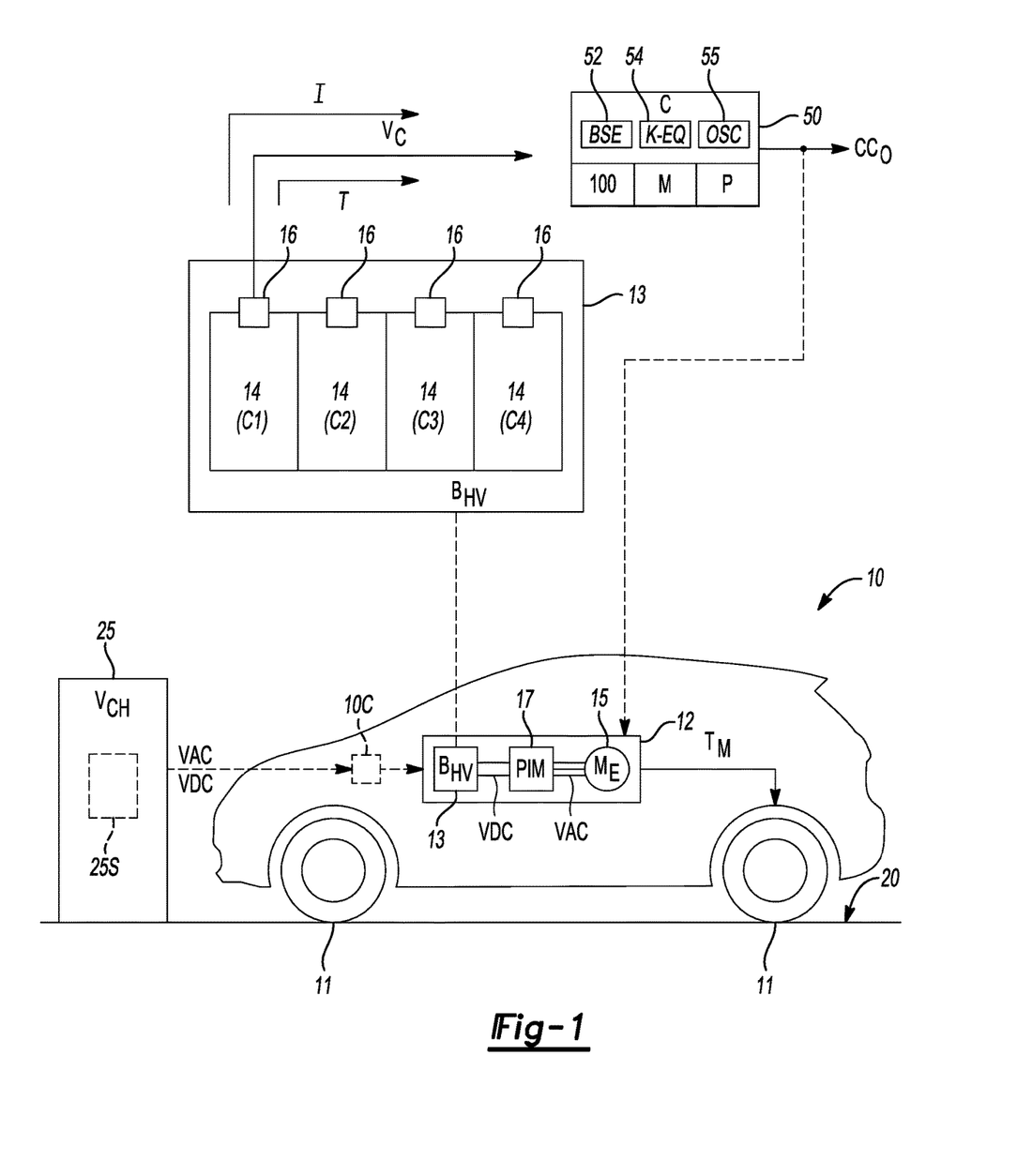
FIG. 1 is a schematic illustration of an example electrical system having a battery pack and a controller, with the latter including battery state estimation (BSE) logic configured to regress battery parameters and estimate a state of the battery pack.

Referring to the drawings, wherein like reference numbers refer to like components, FIG. 1 depicts an exemplary vehicle 10 having an onboard electrical system 12, a controller (C) 50, and a set of road wheels 11, with the latter being in rolling contact with a road surface 20. The vehicle 10 is illustrative of just one possible application of the present teachings, and is used herein solely for the purpose of illustrative consistency. Those of ordinary skill in the art will appreciate that the present teachings may be extended to a wide variety of dynamic systems and devices such as but not limited to motor vehicles, watercraft, aircraft, rail vehicles, mobile platforms, robots, powerplants, or other systems having a similar electrical system 12.

The electrical system 12 in the non-limiting embodiment of FIG. 1 includes a high-energy/high-voltage multi-cell battery pack 13 ($B_{HV}$) whose various battery parameters and states are estimated by the controller 50 as described herein. By way of example and not limitation, the battery pack 13 may have a lithium-ion battery chemistry, and may be capable of outputting at least 18V and as much as 400V or more depending on the configuration.

In some embodiments of the vehicle 10, the electrical system 12 includes a polyphase rotary electric machine ($M_E$) 15 such as a motor-generator unit. In such an embodiment, motor torque (arrow $T_M$) from the energized electric machine 15 may be transmitted to one or more of the road wheels 11 and/or to another coupled load. A power inverter module (PIM) 17 is disposed between the battery pack 13 and the electric machine 15 and configured, in response to pulse width modulation or other suitable high-speed switching control signals and operation of phase-associated semiconductor switches (not shown), to invert a DC voltage (VDC) from the battery pack 13 and thereby generate a polyphase/AC voltage (VAC) for energizing stator windings (not shown) of the electric machine 15. Likewise, operation of the PIM 17 may convert an AC voltage (VAC) from the electric machine 15 into a DC voltage (VDC) suitable for recharging the battery pack 13.

The battery pack 13 noted generally above includes a plurality of electrochemical battery cells 14. Four such battery cells 14 are individually labeled C1, C2, C3, and C4 in FIG. 1 for added clarity and simplicity. The actual number of battery cells 14 used in the construction of the battery pack 13 is application-specific and depends on the energy requirement of electrical loads or devices powered by the battery pack 13, such as but not limited to the rotary electric machine 15. Although shown schematically for illustrative simplicity and clarity, the electric machine 15 may be coupled to the road wheels 11 directly or via intervening gear arrangements and drive axles to power the electric machine 15 in its capacity as an electric traction motor and thereby propel the vehicle along a road surface 20.

Powerflow to or from the electrical system 12 may be managed in real-time by the controller 50, e.g., when configured as a battery system manager or another control device or devices, with the controller 50 regulating ongoing operation of the electrical system 12 via output control signals (arrow $CC_O$). According to the present strategy, the controller 50 employs battery state estimation (BSE) logic 52, an application-specific equivalent circuit model (K-EQ) 54, and sensors 16 that collectively measure and communicate input signals to the controller 50 and its resident BSE logic 52. Such input signals in the illustrated configuration include cell voltages (arrow $V_C$), battery current (arrow I), and battery temperature (arrow T). The input signals may be determined locally within each battery cell 14 or measured collectively at the level of the battery pack 13 and back-calculated or estimated from such levels in different embodiments.

The controller 50, which may be configured as part of a larger battery management system or as a separate computer device or network of such devices, includes a processor (P), e.g., a microprocessor or central processing unit, memory (M) in the form of read only memory, random access memory, electrically-programmable read only memory, etc., a high-speed clock, analog-to-digital and digital-to-analog circuitry, input/output circuitry and devices, and appropriate signal conditioning and buffering circuitry. The strategies described below may be encoded as machine-readable instructions collectively referred to herein as a method 100.

In executing the present method 100, the controller 50 automatically derives the battery's present operating state, including a bulk state of charge and state of power of the battery pack 13. The controller 50 does so using the BSE logic 52 with the assistance of the equivalent circuit model 54, the latter of which generally models behavior of the battery pack 13 using, as circuit elements, the battery voltage, a hysteresis voltage source, ohmic resistance, battery and/or cell voltage, resistance, and capacitance, etc., and accounts for factors such as surface charge on the various battery cells 14. Depending on the complexity of the equivalent circuit model 54, the equivalent circuit model 54 may also account for solid-state diffusion voltage effects and other higher and/or lower frequency voltage effects occurring within the constituent battery cell(s) 14 of the battery pack 13. Collectively, the various voltage effects are added or subtracted from the open-circuit voltage of the battery cell(s) 14.

The particular configuration of the equivalent circuit model 54 is based on the particular application and construction of the battery pack 13 and thus may have a wide variety of constructions. Non-limiting representative example constructions usable as the equivalent circuit model 54 may be found, for instance, in U.S. Pat. No. 9,575,128 entitled "Battery State-Of-Charge Estimation For Hybrid and Electric Vehicles Using Extended Kalman Filter Techniques" issued on Feb. 21, 2017, U.S. Pat. No. 6,639,385 entitled "State of Charge Method and Apparatus" issued on Oct. 28, 2003, and U.S. Pat. No. 7,324,902 entitled "Method and Apparatus for Generalized Recursive Least-Squares Process for Battery State of Charge and State of Health" issued on Jan. 29, 2008, which are hereby incorporated by reference in their entireties.

State of charge and state of power estimations are adapted in real-time using the BSE logic 52. In a possible embodiment, the BSE logic 52 may include an extended Kalman filter and additional current control logic 55 (OSC), with an example of the latter depicted in FIG. 5, to improve overall estimation accuracy in the face of a constant baseline current flowing into or out of the battery pack 13 of FIG. 1. As will be appreciated by those of ordinary skill in the art, an extended Kalman filter formulation is typically used to treat system models having the following general form:

$$x_k = f(x_k, u_k) + w_k$$

$$z_k = h(x_k) + n_k$$

where $w_k$ and $n_k$ are noise factors. For the representative BSE logic 54 of the present disclosure, the input is $u_k = i_k$ = current to or from the battery pack 13. The measured value is $z_k = V_k$, which in this instance is the cell voltage of a battery cell 14 or a pack voltage of the battery pack 13 shown schematically in FIG. 1. $x_k$ is the state vector including battery parameters to be estimated by the BSE logic 52.

As understood in the art, the estimated state of the battery pack 13 and other deterministic systems is the smallest vector summarizing the system's collective past. Alternatives to the extended Kalman filter formulation within the scope of the disclosure include but are not limited to Sigma-Point Kalman Filters and the like, as well as formulations that do not follow Kalman filter formalism, e.g., recursive least-squares regression, particle filters, etc. The extended Kalman filter, which effectively uses a single point and partial derivatives of the associated equivalent circuit model 54, is therefore just one possible approach to regressing battery parameters within the scope of the disclosure.

Still referring to FIG. 1, the present solution enabled by the controller 50 and its resident BSE logic 52 is intended to operate in electrical systems ordinarily having a constant baseline current, such as the exemplary electrical system 12 and battery pack 13. The baseline current contemplated herein may be a charging current supplied by an offboard charging station ($V_{CH}$) 25 that is connectable to the vehicle 10, e.g., via a charging port 10C, to initiate a charging cycle of the battery pack 13. The charging station 25 may deliver an AC or DC charging current depending on the configuration of the offboard charging station 25, or the baseline current may be a battery current supplied by the battery pack 13 to power the electric machine 15, a resistive element, and/or another electrical load. In some embodiments the charging station 25 may be adapted for use as a smart charger 25S, and thus equipped with associated processors, logic, sensors, and other requisite hardware and software for communicating with the controller 50 to determine the charging requirements of the battery pack 13.

As used herein, the term "constant" with respect to the baseline current refers to an electrical current having very low frequency content, e.g., less than about 0.01 Hz or less than about 0.005 Hz in different embodiments. The term "very low" is to be understood relative to the sampling speed of the controller 50 when implementing the BSE logic 52. Such sampling speed may be less than about 1-10 Hz in an exemplary embodiment. As the offboard charging station 25 may be optionally embodied as a DC fast-charger capable of rapidly charging the battery pack 13 with a DC charging voltage and associated DC charging current, a DC current waveform epitomizes constancy within the scope of present disclosure, and thus the constant baseline current treated herein may be a DC charging current or an alternating current (AC) charging current having the above-defined very low frequency content.

As noted above, the controller 50 of FIG. 1 is configured for estimating battery parameters and a present state of a battery pack 13 using the BSE logic 52. In an embodiment, the method 100 includes receiving or delivering a constant baseline current via the battery pack 13 from or to a load, respectively. As described below with reference to FIGS. 2-7, the method 100 includes selectively requesting injection of time-variant frequency content as current oscillations, e.g., a dither signal, into the constant baseline current. This occurs by operation of the controller 50 using the current control logic 55.

Figure 5:
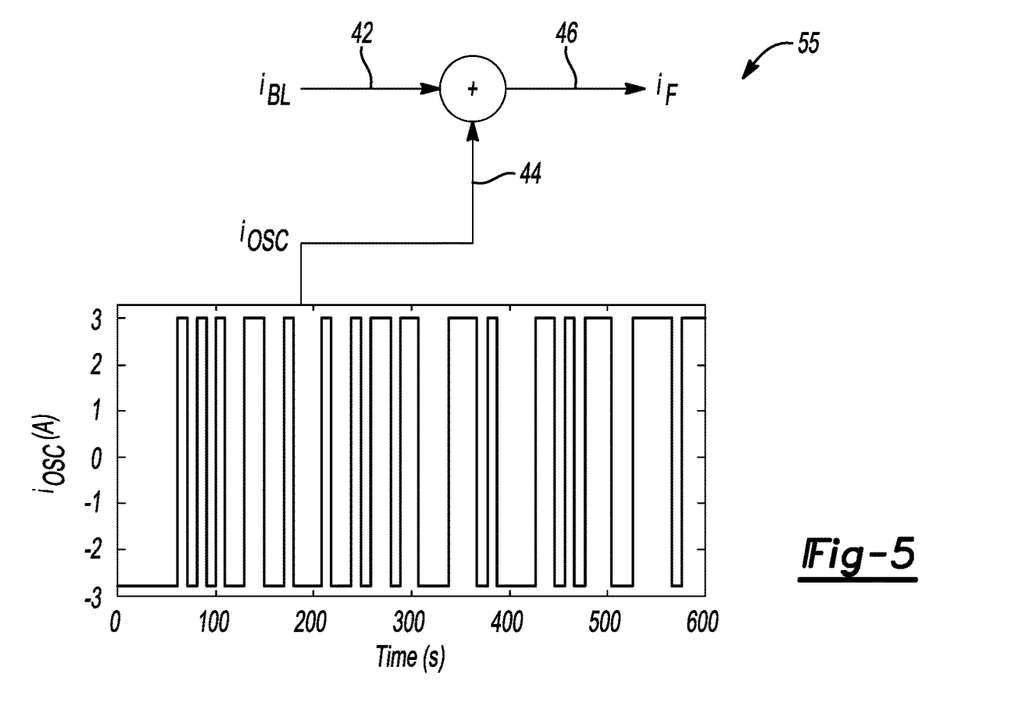
FIG. 5 is a schematic flow diagram depicting charging control logic usable by the controller depicted in FIG. 1 when selectively injecting frequency content into a constant baseline current in accordance with the present teachings, with nominal current oscillation depicted on the vertical axis and time depicted on the horizontal axis.

With respect to the current control logic 55, and referring briefly to FIG. 5, the baseline current ($i_{BL}$) 42 and the current oscillations ($i_{OSC}$) 44, shown as varying in a nominal/representative ±3 A range, sum to combine and form a final current ($i_F$) 46. The non-limiting exemplary embodiment of FIG. 5 depicts the current oscillations 44 as a Pseudo-Random Binary Signal or PRBS oscillation. Alternative embodiments of the current oscillations 44 exist, including a frequency-varied signal such as a pulse-width modulation or pulse-density modulation signal, a sequence of chirp signals, or other varied frequency signals configured to generate sufficient excitation to the BSE logic 52. While the frequency of the current oscillations 44 may vary with the application or within a given implementation, the frequency content should be high relative to the constant baseline current, e.g., a range of about 0.1-1 Hz, or anywhere in such a range, e.g., discrete frequencies of 0.1 Hz, 0.5 Hz, or 1 Hz.

Figure 6:
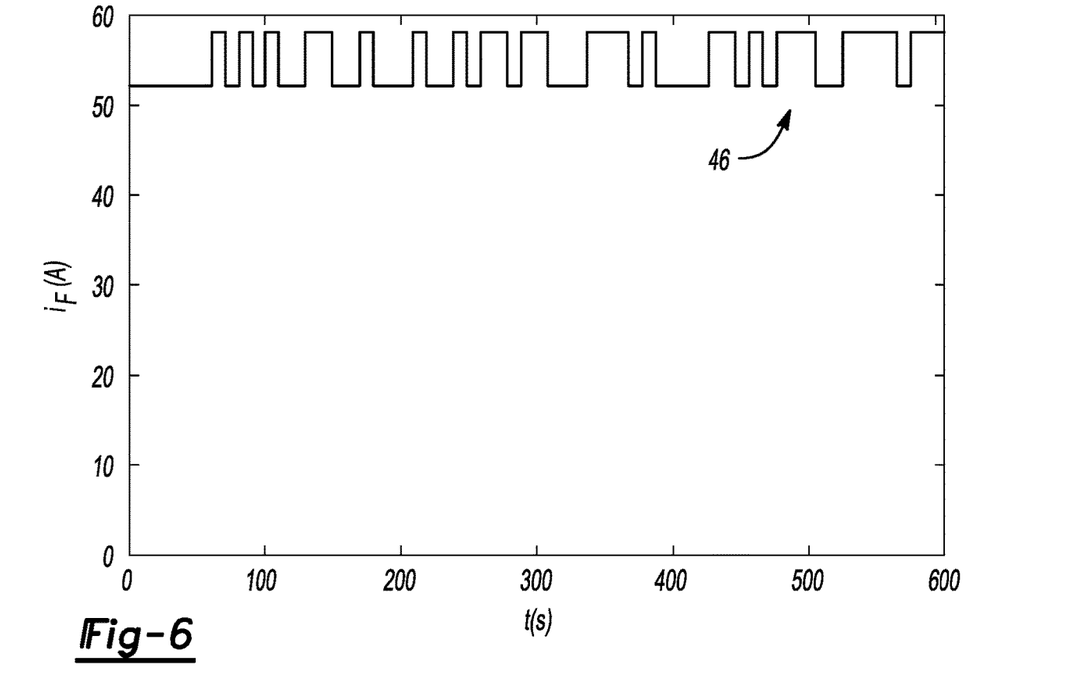
FIG. 6 is a time plot depicting a representative final current on the vertical axis and time depicted on the horizontal axis.

According to the present method 100, a battery parameter of the battery pack 13 such as regressed R-ohmic, capacitance, or OCV is automatically estimated via the BSE logic 52 of FIG. 1 concurrently with injection of the current oscillations 44, with "injection" as used herein referring to a summed combination or overlay of the current oscillations ($i_{OSC}$) 44 respectively with or onto the constant baseline current 42 as indicated by a summation node (+). Temporarily, the resultant waveform, i.e., the final current ($i_F$) 46, an exemplary embodiment of which is shown in FIG. 6 for a representative period of t(s)=600 seconds, is provided to or by the battery pack 13. The controller 50 of FIG. 1 may then estimate the present state of the battery pack 13 using the estimated battery parameter.

Figure 2:
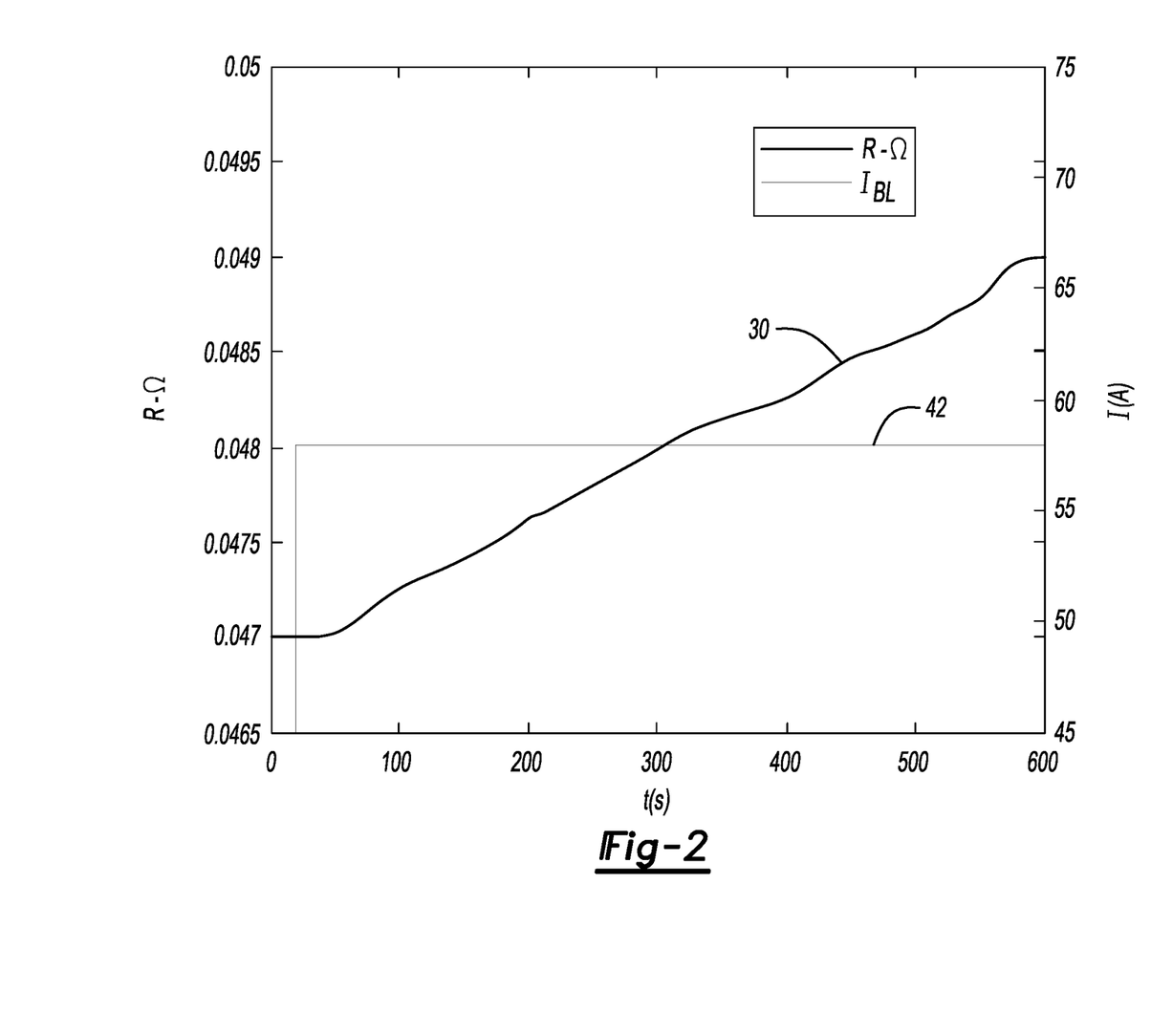
FIG. 2 is a time plot of regressed ohmic resistance (vertical axis) versus time (horizontal axis) in the absence of the present teachings.

Referring to FIG. 2, a potential vulnerability of the BSE logic 52 of FIG. 1, absent the present teachings and use of the current control logic 55 of FIG. 5, is that of the possible degradation of estimation accuracy due to a lack of sufficient frequency content in the constant baseline current 42. The constant baseline current 42, shown for simplicity in FIG. 2 as a step signal and referenced on the vertical axis as I(A), is exemplary of the very low frequency content described above. A representative battery parameter that could be estimated by the BSE logic 52 is a regressed ohmic resistance/R-ohmic (trace 30), which is abbreviated R-Ω and shown on the other vertical axis of FIG. 2. In the illustrated trace 30, regressed ohmic resistance is monotonically increasing. A discrepancy between estimated battery parameters when charging the battery pack 13 of FIG. 1 using a constant charging current and when discharging the battery pack 13 during a typical drive cycle could reduce the overall accuracy of SOC and SOP estimates, with a possible result of such degraded accuracy indicated in FIG. 2 as the monotonically increasing ohmic resistance.

Figure 3A:
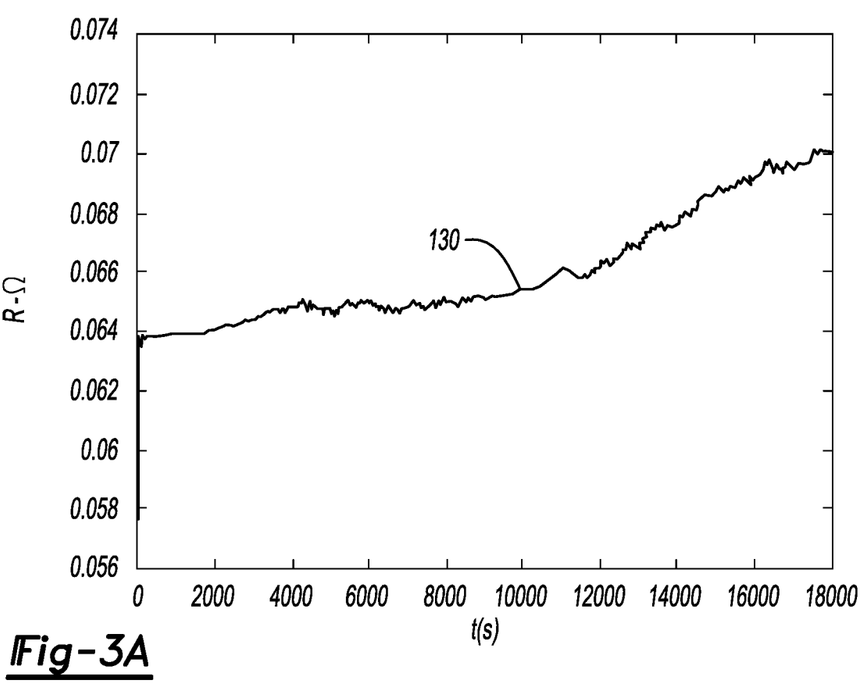
FIGS. 3A and 3B are time plots of regressed ohmic resistance and percentage state of charge depicted on the respective vertical axes and time depicted on the respective horizontal axes for a representative charging cycle.
Figure 3B:
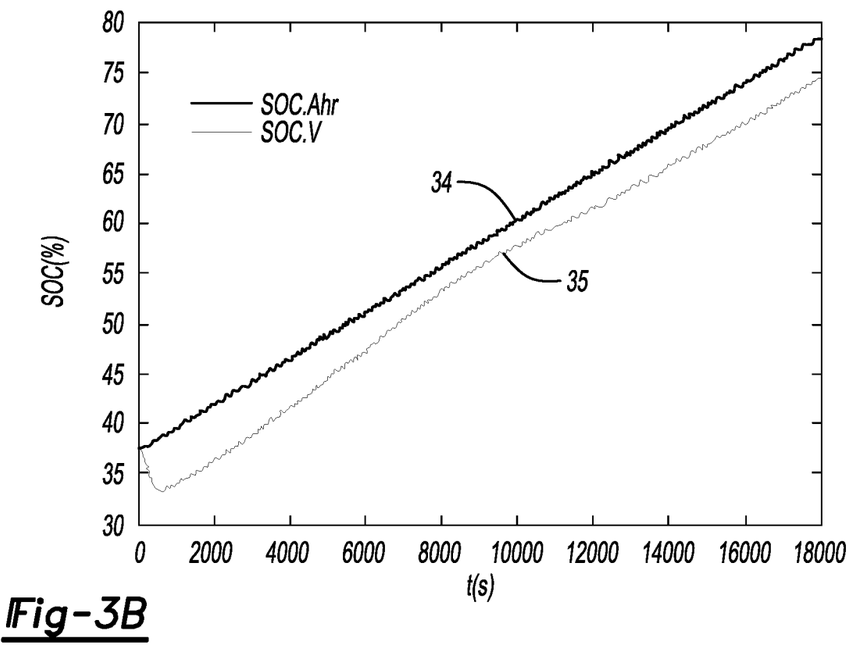

The potential vulnerability in the form of suboptimal estimation accuracy may be better understood with reference to FIGS. 3A, 3B, 4A, and 4B. Trace 130 of FIG. 3A is similar to FIG. 2 in its depiction of a monotonically increasing R-ohmic value of the type that may result from a sustained constant charging current, e.g., from the offboard charging station 25 shown in FIG. 1. In FIG. 3B, for proper calibration of the controller 50 and the resident BSE logic 52, the difference between trace "SOC.V" 35, i.e., the SOC % as regressed by the BSE logic 52, and trace 34 "SOC.Ahr" provided from Coulomb counting methods ideally should be minimal, e.g., less than 5%. In reality, it is difficult to tune onboard calibrations to accurately meet this requirement during constant current charging conditions, as indicated by the variation between traces 34 and 35 in FIG. 3B. Indeed, following a sustained constant charging current, it may take an extended amount of time for R-ohmic and other estimated battery parameters to regress to a normal or expected range during a subsequent drive cycle, for instance taking as much as twenty minutes to more than an hour depending on the initial regressed R-ohmic value at the start of the drive cycle.

Figure 4A:
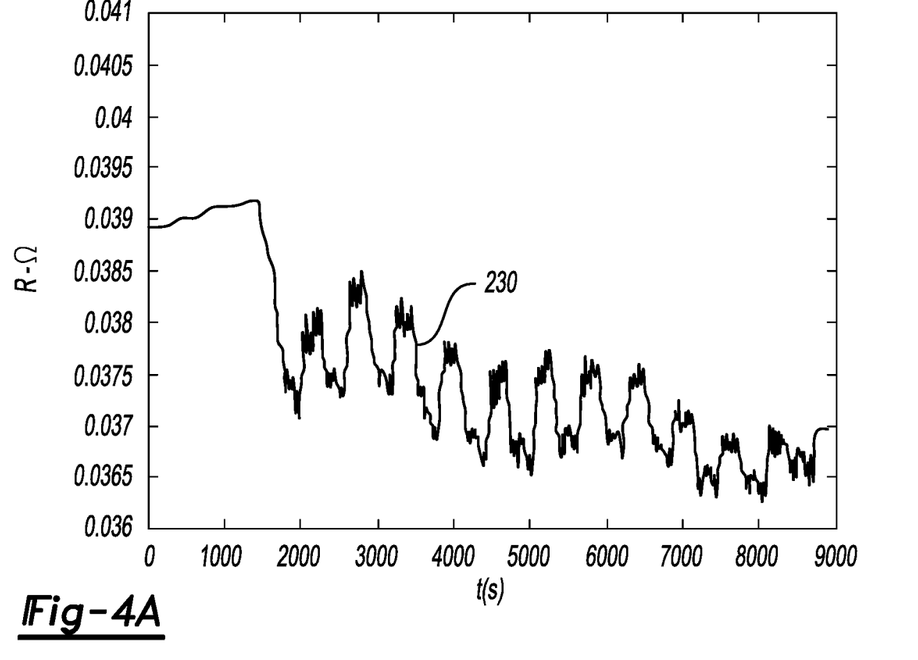
FIGS. 4A and 4B are time plots of regressed ohmic resistance and percentage state of charge depicted on the respective vertical axes and time depicted on the respective horizontal axes for a representative discharging cycle.
Figure 4B:
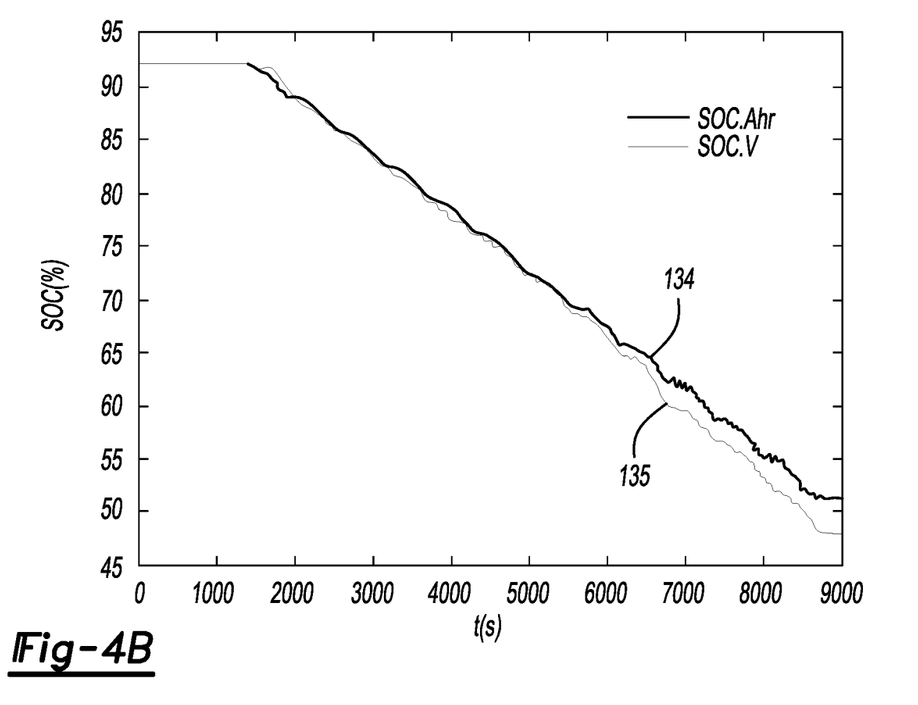

FIGS. 4A and 4B illustrate the effect on the example R-ohmic battery parameter in the face of a non-constant battery current, with FIGS. 4A and 4B representing a response in regressed R-ohmic from the BSE logic 52 when discharging the battery pack 13 during an exemplary drive/discharging cycle of the vehicle 10 shown in FIG. 1. While battery current during a discharging event such as a drive cycle of the vehicle 10 is typically non-constant, e.g., due to rapid variations in output torque request, at times the vehicle 10 may cruise at a fixed speed for an extended duration. The observed effect on estimated or regressed R-ohmic, i.e., trace 230 of FIG. 4A, likewise leads to convergence of traces 34 and 35 relative to the constant current conditions of FIG. 3B. This is illustrated using corresponding traces 134 and 135 in FIG. 4B, which is indicative of increased estimation accuracy of regressed R-ohmic.

As an example application, the battery pack 13 of FIG. 1 may be operated at a constant baseline current, with the regressed R-ohmic value monotonically increasing as shown in FIG. 3A. When the controller 50 of FIG. 1 has determined based on a predetermined condition indicative of insufficient frequency content in the baseline current, the controller 50 requests the injection of the time-variant oscillation 44 (FIG. 5). As a non-limiting illustration, should a constant charge current of 58-amps be provided to the battery pack 13 and the predetermined condition be detected or present indicative of insufficient frequency content in the charge current, the controller 50 may respond by requesting injection of the time-variant oscillations 44 from the current control logic 55 of FIG. 1, such that the charge current is caused to vary sufficiently from 58-amps, such as by oscillating between 48-amps and 58-amps at a frequency of 1 Hz. sensors The predetermined conditions used to trigger frequency content enhancement may depend to some extent on the particular formulation used to implement the BSE logic 52. For example, a timer of the controller 50 may be initiated at the onset of a constant baseline current, with a threshold elapsed time being used as the predetermined condition. Other embodiments of the predetermined condition may include a threshold variation in the baseline current, such as variance in current calculated over a time window, cruise control system status, plug-in charge status, a threshold change in temperature, SOC, and/or voltage of the battery pack 13, etc.

With respect to covariance, Kalman formulations provide a covariance or an approximation thereof, as will be appreciated by those skilled in the art. The magnitude of covariance may be used as the predetermined condition using extended Kalman filters or other Kalman formulations of the BSE logic 52. For example, particle filters keep track of statistical distribution by randomized sampling of the associated model, e.g., the equivalent circuit model 54 of FIG. 1. As an appropriate trigger for selectively injecting the constant baseline current 42 of FIG. 7 with additional frequency content of the current oscillations 44, parameter fitting techniques could be subjected to a statistical analysis, e.g., via analytic formula or by brute-force methods. Using "brute force" approaches, one can take a measured signal, perturb it with noise at the level of accuracy of the sensors 16 of FIG. 1, and then re-compute the relevant battery parameters. By repeating such a process many times, a cloud of parameter values is generated that indicates the covariance. Sigma-Point Kalman filters by comparison compute covariance from just a few selected perturbed points, while the extended Kalman filter uses a single point and partial derivatives of the equivalent circuit model 54.

In a general sense, signal-to-noise ratio (SNR) is used to inform the injection triggering decision. A good measure of SNR in the example extended Kalman filter embodiment of the BSE logic 52 would be to compare the estimate of the battery parameter to the estimate of its standard deviation. If x is the column vector of battery parameters, the extended Kalman filter produces an estimate, x*, and a covariance matrix, $C=\varepsilon\{(x-x^*)(x-x^*)^T\}$, where $\varepsilon\{\cdot\}$ is the expectation. Then, for the $i^{th}$ battery parameter, $|x_i^*|/\sqrt{C_{ii}}$ is a measure of how accurately the extended Kalman filter thinks it is measuring that parameter. In the case of ohmic resistance, for instance, k may serve as the index for R-ohmic. Taking the reciprocal, we might initiate current oscillation when $$\frac{\sqrt{C_{kk}}}{|x_k^*|} = \frac{\sigma(Rohmic)}{Rohmic}$$

exceeds a specified value, with σ representing standard deviation, i.e., the square-root of variance. Similarly, the controller 50 could decide to situationally inject the time-variant current oscillation 44 whenever another battery parameter loses accuracy by a similar criterion.

From calibration, the controller 50 is provided with a rough value of the battery parameters, which could be used instead of the estimate, which as noted herein may become unreliable. The calibration values are typically stored in tables, e.g., with R-ohmic stored in a table indexed by % SOC and temperature. Letting $X_i$(SOC,T) be the look-up value of parameter $x_i$, the controller 50 could set a value of $\sqrt{C_{ii}}/X_i$(SOC,T) where injection of the time-variant current oscillation is triggered. An EKF may be implemented in square-root form, in which case it gives a matrix S such that $C=S^T S$. Thus, the controller 50 may calculate $C_{ii}$ from S in some embodiments. Instead of a ratio, the controller 50 could alternatively trigger on $\sqrt{C_{ii}}$.

In the equivalent circuit model 54 of FIG. 1, ohmic resistance is a higher-frequency impedance. At a representative 100 ms sample rate (i.e., 10 Hz), regressed R-ohmic corresponds to the impedance of the battery pack 13 at frequencies above about 1 Hz. If the baseline current 42 has no frequency content above 0.1 Hz, for instance, there is a lack of information available to accurately estimate R-ohmic, causing the estimate to become unreliable and drift. Other battery parameters model lower-frequency effects, and thus do not require as high of a frequency content to fit. However, lower-frequency battery parameters may likewise drift if the frequency content of the baseline current is very low. In the absence of sufficient excitation, the uncertainty in a given battery parameter grows with time. Thus, the predetermined condition within the scope of the disclosure may extend to the above-noted and other criteria for judging that too much time has elapsed since a significant current oscillation, which in turn would trigger a request for the currents oscillation 44 of FIG. 7.

Figure 7:
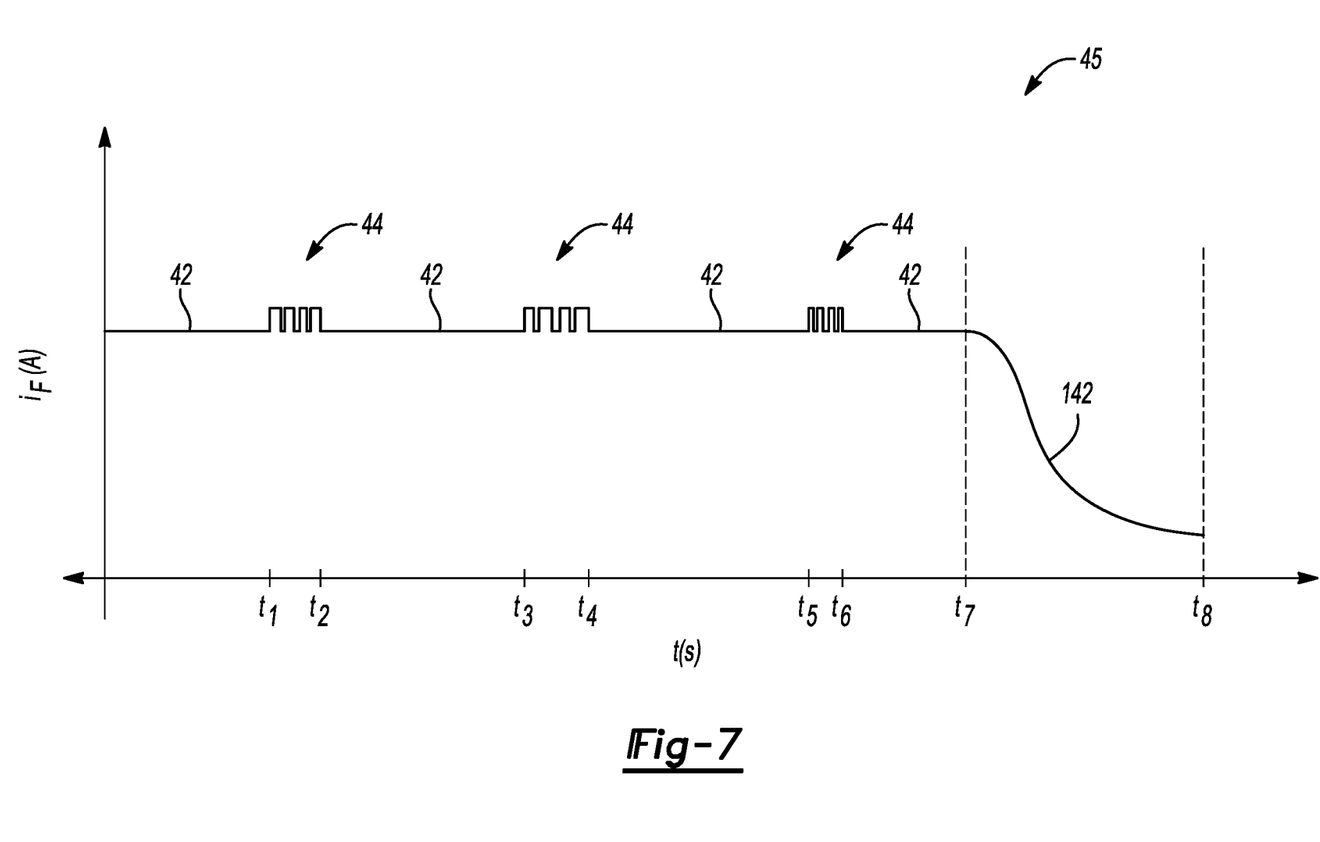
FIG. 7 is a time plot showing a representative application of the present method, with magnitude of a final current depicted on the vertical axis and time depicted on the horizontal axis.

FIG. 7, which is best understood in conjunction with FIG. 5, is a time plot 45 schematically depicting the final current ($I_F$) 46 of FIG. 5 in amps (A) with intermittently-injected time-variant current oscillations 44. As explained above, the final current 46 is the sum of the constant baseline current 42 and the current oscillations 44, and therefore the constant baseline current 42 equals the final current 46 of FIG. 5 when the current oscillations 44 are discontinued.

Commencing at $t_0$ with receipt or delivery of the constant baseline current 42 via the battery pack 13 shown in FIG. 1, the controller 50 selectively requests injection of the current oscillations 44 into the constant baseline current 42 at about $t_1$ in response to a predetermined condition, various options for which are set forth above. This injection continues until $t_2$. The decision as to precisely when to commence and discontinue injection of a given current oscillation 44 may be made by the controller 50 using the predetermined condition(s), a few examples of which are set forth below. The controller 50 of FIG. 1 estimates ohmic resistance, impedance, and OCV and/or other battery parameters of the battery pack 13 via the BSE logic 52. Estimation occurs concurrently with injection of the current oscillations 44, as well as at other times. The controller 50 may thereafter estimate the present state of the battery pack 13 using the estimated battery parameter(s).

As depicted in FIG. 7 for a representative charging cycle in which constant current charging commences at $t_0$ and continues until $t_7$, and in which constant voltage charging commences at $t_7$ and continues until $t_8$ (as trace 142), the selective injection of the current oscillations 44 need not be continuous. In the illustrated embodiment, for instance, the controller 50 requests injection of the current oscillations 44 between $t_1$ and $t_2$, $t_3$ and $t_4$, and $t_5$ and $t_6$. The frequency content of the current oscillations 44 may be the same at each instance of injection, or it may be different as shown.

Various embodiments exist that are suitable predetermined conditions for triggering injection of the current oscillations 44, with the embodiment possibly depending on the formulation of the BSE logic 52 as noted above. By way of example and not limitation, the predetermined condition may include a covariance or an estimated error value from the BSE logic 52 indicative of a level of confidence in estimation accuracy of the battery parameter. The predetermined condition may include a calibrated duration over which the constant baseline current 42 remains constant prior to injection of the current oscillations 44, with such an alternative relying on the use of a timer, for instance of the controller 50. Other values may be used as predetermined conditions/triggering conditions, such as but not limited to a predefined temperature differential, Amp-hour differential, and/or covariance differential of the battery pack 13.

Additionally, the offboard charging station 25 of FIG. 1 may have different configurations and capabilities which informs the range of options afforded the controller 50 for implementing the present teachings. For example, during a charging operation in which the offboard charging station 25 is connected to the battery pack 13/vehicle 10 and is actively charging the battery pack 13, the controller 50 may request a particular constant charging current, e.g., 10-amps, for a brief duration. Such a charging current may be immediately followed by a different constant charging current, e.g., 8-amps, followed again by another 10-amp charging current and so forth. In this illustrative example, the duration and possibly magnitude of each successive charging current may be selected by the controller 50 to produce the requisite frequency content for exciting the BSE logic 52.

The offboard charging station 25 may be configured as the smart charger 25S shown in FIG. 1, i.e., a station programmed for and thus capable of communicating wirelessly or over hardwired transfer conductors with the controller 50 to determine the charging requirement and capabilities of the battery pack 13. In such an embodiment, the controller 50 may request injections of the current oscillations 44 into the constant baseline current 42 by communicating a charging request to the smart charger 25S, with the smart charger 25S detecting a requirement of the battery pack 13 for the final current 46. The smart charger 25S in such an embodiment responds by transmitting the final current 46 to the battery pack 13 as a charging current, with the composition of the final current 46 at a given time instant being either the constant current 42 alone or a combination of the constant current 42 and the time-variant current oscillations 44.

As yet another embodiment, the battery pack 13 could receive or output a constant current, e.g., 10 A. To provide the requisite frequency content, the controller 50 could selectively discharge 1-2 A of current, such as by selectively activating a resistive load or resident electrical component of the vehicle 10. The particular load may vary with the application, and thus may range from sufficiently high-current devices as a battery or RESS heater, air conditioning compressor, etc. Selective discharge of the battery pack 13 may occur in this embodiment during active drive states of the vehicle 10, for instance while cruising at a constant velocity, or during active charging states of the vehicle 10.

The method 100 set forth above is thus intended to improve the accuracy of state and parameter estimates of typical battery state estimators. The output of a battery state estimator will tend to grow with higher frequency content in its input. However, low-frequency content leads to reduced output, such as is the case with DC charging current or other currents varying by less than 0.01 Hz. If the output has not exceeded a given threshold for too long, the controller 50 could request injection of the above-described current oscillations 44. For parameters associated to lower-frequency effects, some implementations may use separate triggers or predetermined conditions, each with its own time constant. Essentially, the present approach selectively adds sufficient frequency content to ensure a given signal rises above an associated noise level, and thereby addresses a vulnerability in common BSE approaches used with motor vehicles and other systems having the battery pack 13 described above. These and other benefits will be readily appreciated by those of ordinary skill in the art in view of the forgoing disclosure.

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the present disclosure. Moreover, the present concepts expressly include combinations and sub-combinations of the described elements and features. The detailed description and the drawings are supportive and descriptive of the present teachings, with the scope of the present teachings defined solely by the claims.

What is claimed is:

1. A method for estimating a present state of a battery pack using a controller having battery state estimator (BSE) logic, the method comprising:
    receiving or delivering a constant baseline current via the battery pack;
    selectively requesting injection of current oscillations having time-variant frequency content into the constant baseline current, via the controller in response to a predetermined condition, wherein the constant baseline current and the current oscillations combine to form a final current;
    estimating a battery parameter of the battery pack via the BSE logic concurrently with the current oscillations to thereby generate an estimated battery parameter; and
    estimating the present state of the battery pack via the controller using the estimated battery parameter to thereby generate an estimated battery state of the battery pack.

2. The method of claim 1, wherein the BSE logic includes a Kalman filter.

3. The method of claim 1, further comprising: controlling powerflow to or from the battery pack via the controller using the estimated battery state.

4. The method of claim 3, wherein selectively requesting the injection of the current oscillations into the constant baseline current includes requesting a constant charging current, via the controller, from an offboard charging station as the constant baseline current, and wherein controlling powerflow to or from the battery pack includes charging the battery pack using the final current.

5. The method of claim 3, wherein selectively requesting the injection of the current oscillations into the constant baseline current includes selectively controlling an ON/OFF state of an electrical load connected to the battery pack while receiving or delivering the constant baseline current to thereby create the current oscillations, and wherein controlling the powerflow to or from the battery pack includes discharging the battery pack to the electrical load.

6. The method of claim 3, wherein selectively requesting the injection of the current oscillations into the constant baseline current includes selectively requesting, from an offboard charging station, a series of constant charging currents each having a different frequency content to thereby create the current oscillations, and wherein controlling the powerflow to or from the battery pack using the estimated battery state includes charging the battery pack using the final current.

7. The method of claim 1, wherein selectively requesting the injection of the current oscillations into the constant baseline current includes communicating a charging request from the controller to an offboard smart charger that is configured to detect a requirement of the battery pack for the final current, and that is configured to transmit the final current to the battery pack as a charging current.

8. The method of claim 1, wherein estimating the battery parameter includes estimating an ohmic resistance, an impedance, and/or an open-circuit voltage of the battery pack.

9. The method of claim 1, wherein a frequency of the current oscillations is less than about 1 Hz, and the constant baseline current has a frequency of less than about 0.01 Hz.

10. The method of claim 1, wherein the current oscillations include a pseudo-random binary signal having a time-variant frequency.

11. The method of claim 1, wherein the current oscillations include a pulse width modulation signal or a pulse density modulation signal having a time-variant frequency.

12. The method of claim 1, wherein the current oscillations are a sequence of chirp signals.

13. The method of claim 1, wherein the predetermined condition includes a threshold covariance or an estimated error value from the BSE logic.

14. The method of claim 1, wherein the predetermined condition includes a calibrated duration over which the constant baseline current remains constant prior to injection of the current oscillations.

15. An electrical system comprising:
a battery pack;
a rotary electric machine that is electrically connected to and driven by the battery pack; and
a controller configured to estimate a present state of a battery pack using battery state estimator (BSE) logic, wherein the controller is configured to:
determine, via the BSE logic, a frequency content of a constant baseline current delivered to or from the battery pack, wherein the constant baseline current has a frequency of less than about 0.01 Hz;
selectively request an injection of current oscillations into the constant baseline current in response to a predetermined condition, wherein the constant baseline current and the current oscillations combine to form a final current, and wherein the current oscillations have a frequency in a range of between about 0.1 Hz and 1 Hz;
estimate a battery parameter of the battery pack via the BSE logic concurrently with the current oscillations to thereby generate an estimated battery parameter, wherein the estimated battery parameter is an ohmic resistance, an impedance, and/or an open-circuit voltage of the battery pack;
estimate the present state of the battery pack using the estimated battery parameter as an estimated battery state; and
control powerflow from or to the electric machine respectively to or from the battery pack using the estimated battery state.

16. The electrical system of claim 15, wherein the BSE logic includes a Kalman filter.

17. The electrical system of claim 16, wherein the predetermined condition includes a covariance value, and wherein the estimated battery parameter is a regressed ohmic resistance of the battery pack.

18. The electrical system of claim 15, wherein the controller is configured to selectively request the injection of the current oscillations into the constant baseline current by requesting a constant charging current from an offboard charging station as the constant baseline current, and to control charging of the battery pack as the powerflow using the final current.

19. The electrical system of claim 15, wherein the current oscillations include a pseudo-random binary signal, a pulse width modulation signal, a pulse density modulation signal, and/or a sequence of chirp signals.

20. The electrical system of claim 15, further comprising one or more road wheels connected to the rotary electric machine.

* * * * *